(12) United States Patent
Vogel et al.

(10) Patent No.: US 8,042,072 B2
(45) Date of Patent: Oct. 18, 2011

(54) POWER MESH FOR MULTIPLE FREQUENCY OPERATION OF SEMICONDUCTOR PRODUCTS

(75) Inventors: Danny Carl Vogel, Sudbury, MA (US); Daniel Deisz, McLean, VA (US)

(73) Assignee: LSI Corporation, Milpitas, CA (US)

( * ) Notice: Subject to any disclaimer, the term of this patent is extended or adjusted under 35 U.S.C. 154(b) by 514 days.

(21) Appl. No.: 12/185,864

(22) Filed: Aug. 5, 2008

(65) Prior Publication Data
US 2008/0320431 A1 Dec. 25, 2008

Related U.S. Application Data

(62) Division of application No. 11/003,309, filed on Dec. 3, 2004, now Pat. No. 7,424,696.

(51) Int. Cl.
*G06F 17/50* (2006.01)
(52) U.S. Cl. ........................................ 716/100; 716/110
(58) Field of Classification Search .......... 716/100–103, 716/110
See application file for complete search history.

(56) References Cited

U.S. PATENT DOCUMENTS 6,823,502 B2 * 11/2004 Wingren et al. ............. 716/102
7,269,803 B2 * 9/2007 Khakzadi et al. ............. 716/120

* cited by examiner

*Primary Examiner* — Jack Chiang
*Assistant Examiner* — Binh Tat
(74) *Attorney, Agent, or Firm* — Otterstedt, Ellenbogen & Kammer, LLP

(57) ABSTRACT

The design of integrated circuits, i.e., semiconductor products, is made easier with a semiconductor platform having versatile power mesh that is capable of supporting simultaneous operations having different frequencies on the semiconductor product; e.g., higher frequency operations may be embedded as diffused blocks within the lower layers or may be programmed from a configurable transistor fabric above the diffused layers. Preferably the power mesh is located above the layers having the operations requiring the different frequencies, and may be fixed in an application set given to a chip designer or may be configurable by the designer her/himself. For example, to support high speed communications adjacent an embedded high speed data transceiver, the transistor fabric may be programmed as a data link layer having higher performance requirements than the rest of the integrated circuit. The data link layer may be connected to one of the localized grids of the versatile power mesh which may have an increased density and/or wider strap width of a power/ground grid. Additional decoupling capacitance can be embedded in the lower layers of the semiconductor product and/or can be programmed from the configurable transistors fabric.

17 Claims, 8 Drawing Sheets

POWER MESH FOR MULTIPLE FREQUENCY OPERATION OF SEMICONDUCTOR PRODUCTS

CROSS REFERENCE TO RELATED APPLICATIONS

This application is a divisional of U.S. patent application Ser. No. 11/003,309 filed on Dec. 3, 2004, now issued as U.S. Pat. No. 7,424,696, which is incorporated herein by reference.

BACKGROUND OF THE INVENTION

1. Field of the Invention

This invention relates generally to the field of electronic circuit design and more particularly relates to a semiconductor platform having a configurable power mesh for multiple frequency and power requirements on a semiconductor product.

2. Description of Related Art

Integrated circuits and chips have become increasingly complex and the speed and capacity of chips doubles about every eighteen months because of advances in design software, fabrication technology, semiconductor materials, and chip design. The increased density of transistors per square centimeter and faster clock speeds, however, make it increasingly difficult to specify and design a chip that performs as actually specified. Unanticipated and sometimes subtle interactions between the transistors and other electronic structures often adversely affect the performance of the circuit. These difficulties increase the expense and risk of designing and fabricating chips, especially those that are custom designed for a specific application; yet the demand for complex custom-designed chips increases with the burgeoning number and variety of microprocessor-driven applications and products. The time and money required to design chips have become a bottleneck to bring these new semiconductor products to market. Without an assured successful outcome that the semiconductor product will be designed within a specified time and will perform as designed, the risks have risen along with costs and the result is that fewer organizations are willing to attempt the design and manufacture of custom chips.

What makes integrated circuits so expensive requiring intensive effort is that they are comprised of millions of transistors and the electrical interconnections between them. Some fundamental anatomy of an integrated circuit will be helpful for a full understanding of the factors affecting the flexibility and difficulty to design a high speed integrated circuit. An integrated circuit comprises layers of a semiconductor, usually silicon, with specific areas and specific layers having different concentrations of electron and hole carriers and/or insulators. The electrical conductivity of the layers and of the distinct areas within the layers is determined by the concentration of dopants within the area. In turn, these distinct areas interact with one another to form transistors, diodes, and other electronic devices. These specific transistors and other devices may interact with each other by field interactions or by direct electrical interconnections. Openings or windows are created for electrical connections between the layers by a combination of masking, layering, and etching additional materials on top of the wafers. Electrical interconnections may be within the semiconductor or may lie above the semiconductor areas in layers of a complex mesh of conductive power, ground, and signal lines, usually of material such as platinum, gold, aluminum, tungsten, or copper metal. Depending upon the interconnection topology, also very complex, transistors perform Boolean logic functions like AND, OR, NOT, NOR and are referred to as gates. Insulative layers, e.g., silicon dioxide, may separate any of these semiconductor or connectivity layers. A power distribution network of power, ground, and signal lines in a multilayered grid typically spans the entire die or a large functional unit in each metallization layer and is horizontally related to decoupling capacitors diffused in the base wafer. The power and ground lines typically alternate in the layers and the power/ground/signal straps are typically orthogonal to the power/ground/signal straps in the layers above and/or below it. Vias connect a power (ground) line or strap to another power (ground) line/strap at the overlap sites. Signal lines typically surround the power/ground straps. To facilitate higher operating frequencies on the integrated circuits, additional decoupling capacitors were typically diffused in the base layer and, up till now, the power mesh was fixed in the layers above the capacitors with a fixed number of horizontal and vertical straps in the layers.

Meanwhile, integrated circuit design has developed a modular approach in which the areas or blocks of transistors and their respective functions are fixed and other areas in which the transistors and their functions are totally or partially programmable and/or customizable. The proportion of fixed-to-programmable modules in an integrated circuit is determined by the complexity, cost, time, and design constraints. The programmable modules or entire integrated circuits may be made up of a field programmable gate array (FPGA) that is a logic chip that can be reprogrammed to obtain different functions. FPGAs are used primarily for prototyping integrated circuit designs but once the designs are set, faster hard-wired chips are produced. On one hand, although the gate arrays are programmable making the FPGAs flexible and modification trivial, the power mesh of FPGAs is fixed in the lower levels. In addition, FPGAs are very expensive and have the largest die size. FPGAs, thus, have a high cost per function, low speed, and high power consumption. Programmable gate arrays (PGAs) are also flexible in the number of possible applications that can be achieved but are not quite as flexible as the FPGAs and are more time-consuming to modify and test. An application specific integrated circuit (ASIC) is another type of chip designed for a particular application. ASICs are efficient in use of power compared to FPGAs and are quite inexpensive to manufacture at high volumes. ASICs, however, are very complex to design and prototype because of their speed and quality. Application Specific Standard Products (ASSPs) are hard-wired chips that meet a specific need but this customization is both time-consuming and costly. An example of an ASSP might be a microprocessor in a heart pacemaker.

In the industry, a new paradigm for the design of semiconductor products has emerged; one company may develop the register transfer logic (RTL) of a semiconductor platform having embedded elements and programmable elements. The RTL of the semiconductor platform is then given to a chip designer in the same or another company who incorporates other embedded elements and programs the remaining platform into a specific semiconductor product. The platform may have embedded elements diffused into the semiconductor wafer that may function at higher frequencies than other embedded elements. Examples of those blocks or elements operating at higher frequencies may be input/output communication devices and/or processors operating in the range of gigahertz frequencies. The programmable elements typically comprise a "sea" or "fabric" of transistors that can be logically configured and interconnected among each other and among the metal layers to achieve a specific application. The transistor fabric and the power grid/decoupling capacitors are typically predesigned to operate at an expected maximum frequency and switching limits (currently about 166 MHz) for the custom logic they are expected to support. Thus, even though the transistors may switch at higher frequencies, the collateral power grid and decoupling capacitors do not support these higher frequency functions because the increased high frequency harmonics result in increased noise. A shortcoming of this model of readily-available platforms is that transistor fabric is offered in a "one size fits all" configuration. Whether the fabric is adjacent to a high speed input/output communication port on the chip or in the interior of the chip where potentially lower speed state machines might be instantiated, the same frequency and power limits exist because the fabric is homogeneous. High speed communications, moreover, have many variations; each variation requiring different components in the integrated circuit associated with its communications protocol.

In order to function in the realm of higher frequencies, a denser grid of power and ground lines and more decoupling capacitors are required to manage the higher power dissipation, inductance, and other electrical characteristics, but in the present technology the number of and the placement of decoupling capacitors and the power grid itself has been fixed and cannot accommodate the demand for higher performance. Increasing the capability of the underlying grid may enable higher frequencies but reduces the density of the support transistor fabric while increases the routing difficulty. Merely "beefing up" the grid worsens the economics of the platform. Careful layout and review of those areas of design are also possible, allowing the frequency limits to be exceeded in small constrained areas of the design, but this approach may not work for all designs and, more importantly, it is extremely time-consuming demanding intensive engineering. Finally, designs requiring higher frequency operation can be "widened" which means increasing the number of data paths by two or more, and decreasing the operating frequency in order to maintain bandwidth. Increasing bus widths in order to limit frequency requirements is workable but that approach increases the latency for data passing through the system. Increasing the bus size by two or more increases routing complexity by much more. Thus, there is an inevitable compromise between high frequency and power requirements.

The semiconductor platform may include an electrical and mechanical transceiver hardware, called a PHY, embedded in the platform for high speed digital and/or optical communication. The PHY hardware typically amplifies, modulates, shapes the wave forms, transmits, and receives the electrical impulses, light or radio signals of the data. The PHY also encodes and decodes the data stream to and from the upper protocols, serializes coded groups into bit streams and then deserializes the receiving bit streams into code groups. An example of one kind of PHY embodies full duplex, point-to-point communications channel for gigabit speed serial interfaces that is independent of the communication protocol and may be independent of the media. Another type of PHY may be an optoelectronic interconnect for broadband and networking applications for extremely high bandwidth CMOS ASICs. Some communication protocols, such as Ethernet, Fibre Channel, SONET/SDH, Serial ATA, and ATM, require specialized PHY layers. The PHY is connected to the next protocol, the data link protocol, in which data packets are encoded and decoded into bits. The data link layer, with knowledge of the transmission protocol, manages errors in the PHY, flow control, and frame synchronization.

Not only do digital communications among networks require high speed interfaces and processing, processing functions on the chip process are faster and faster. The fastest computer now processes on the order of 36 trillion operations per second. These fast processors require fast registers, fast memories called caches, and fast busses that move data in and out of the processors and memory. Processor architecture is a complete science onto itself and is as complex or more so than high speed communications which may be encompassed within the processing and data availability requirements. Simply put, everything is faster today—from the processors, the registers, the caches, the communications buses, the protocols, the PHYs—at least one section of an integrated circuit today is dedicated to high speed operations.

Because there are so many variations in the applications, the data, the speeds, and standards, it is very expensive and burdensome to design and manufacture individual full custom chips for specific applications, specific processors, and protocols. Thus, there is a need in the industry to accommodate desired flexibility and variety available in high speed digital processing, communication, and information handling systems. In addition, developers need off-the-shelf building blocks to design these multisystem solutions to save time and engineering resources.

There is an additional need in the industry to offer flexibility to implement high-speed data processing and/or communications in specific areas of an integrated circuit in order to minimize power and complexity.

SUMMARY OF THE INVENTION

The inventors submit herewith for consideration an application set for implementing multiple frequency operations in an integrated semiconductor product, the platform comprising a plurality of diffused components; a configurable gate array; and a power mesh connecting at least one of the plurality of diffused components to the configurable gate array, the power mesh having at least two grids, wherein the configurable gate array connected to a first grid can support a higher frequency operation than the gate array connected to the second grid. The power mesh may have localized grids wherein one of the grids may have a different pitch between the power and/or differing width of the power and ground straps of the power mesh; and additional decoupling capacitance to mitigate harmonic interference resulting from the differing, preferably increased, pitch. The power mesh may be fixed, meaning that it is part of the application but having localized grids capable of supporting different frequency operations. Additional decoupling capacitance may be diffused in lower layers of the application set, or can be configured from transistors within the configurable gate array. The power mesh, whether configurable or fixed, is preferably positioned above the configurable gate array.

There may be one or more localized grids of the power mesh, each grid capable of operating at a different, preferably, higher frequency than the default frequency of the application set. Functions which may implement the multiple frequencies may be configured or programmed from the transistor fabric to which the power mesh may be connected and may include a data link layer connected to at least one of a plurality of PHYs, a one high speed register, high speed cache memory, or a high frequency data bus.

The invention is also a method to design a semiconductor product, comprising the steps of selecting an application set, the application set having a plurality of physical resources comprising embedded functions and a configurable transistor fabric, the semiconductor platform further comprising a plurality of logical resources corresponding to the physical resources of the semiconductor platform; reading a customer's requirements comprising the desired performance of a semiconductor product; determining that the selected application set does not meet the desired performance of the customer's requirement; calculating a plurality of parameters to meet the desired performance of the customer's requirement; modifying a power mesh; and modifying the configurable transistor fabric to meet the desired performance of the customer's requirements. The step of modifying the configurable transistor fabric may entail programming a first portion of the transistor fabric to instantiate a first function having higher frequency operations than a second portion of the transistor fabric; modifying the power mesh in the vicinity of the first portion to support the first function having higher frequency operations; and adding decoupling capacitance in the vicinity of the modified power mesh. The functions capable of taking advantage of the multiple frequencies enabled by the modified power mesh may include a data link layer for high speed I/O communications, a high speed cache memory, a high speed data bus, and/or a high speed processor. These steps may further be implemented on a machine-readable medium that causes a computer to implement the steps thereof.

The invention may further be construed as a semiconductor platform comprising a plurality of physical resources of at least configurable transistor fabric, a plurality of logical resources corresponding to the physical resources of the semiconductor platform; and a configurable power mesh to support multiple frequency operations configurable from the transistor fabric.

Other aspects and features of the present invention, as defined solely by the claims, will become apparent to those ordinarily skilled in the art upon review of the following non-limited detailed description of the invention in conjunction with the accompanying figures.

BRIEF DESCRIPTION OF THE DRAWINGS

The numerous advantages of the present invention may be better understood by reference to the accompanying figures in which.

DETAILED DESCRIPTION OF THE ILLUSTRATED EMBODIMENTS

The present invention now will be described more fully hereinafter with reference to the accompanying drawings in which illustrative embodiments of the invention are shown. This invention may, however, be embodied in many different forms and should not be construed as limited to the embodiments set forth herein; rather, these embodiments are provided so that this disclosure will be thorough, complete, and will fully convey the scope of the invention to those skilled in the art. Like numbers refer to like elements throughout.

Figure 1:
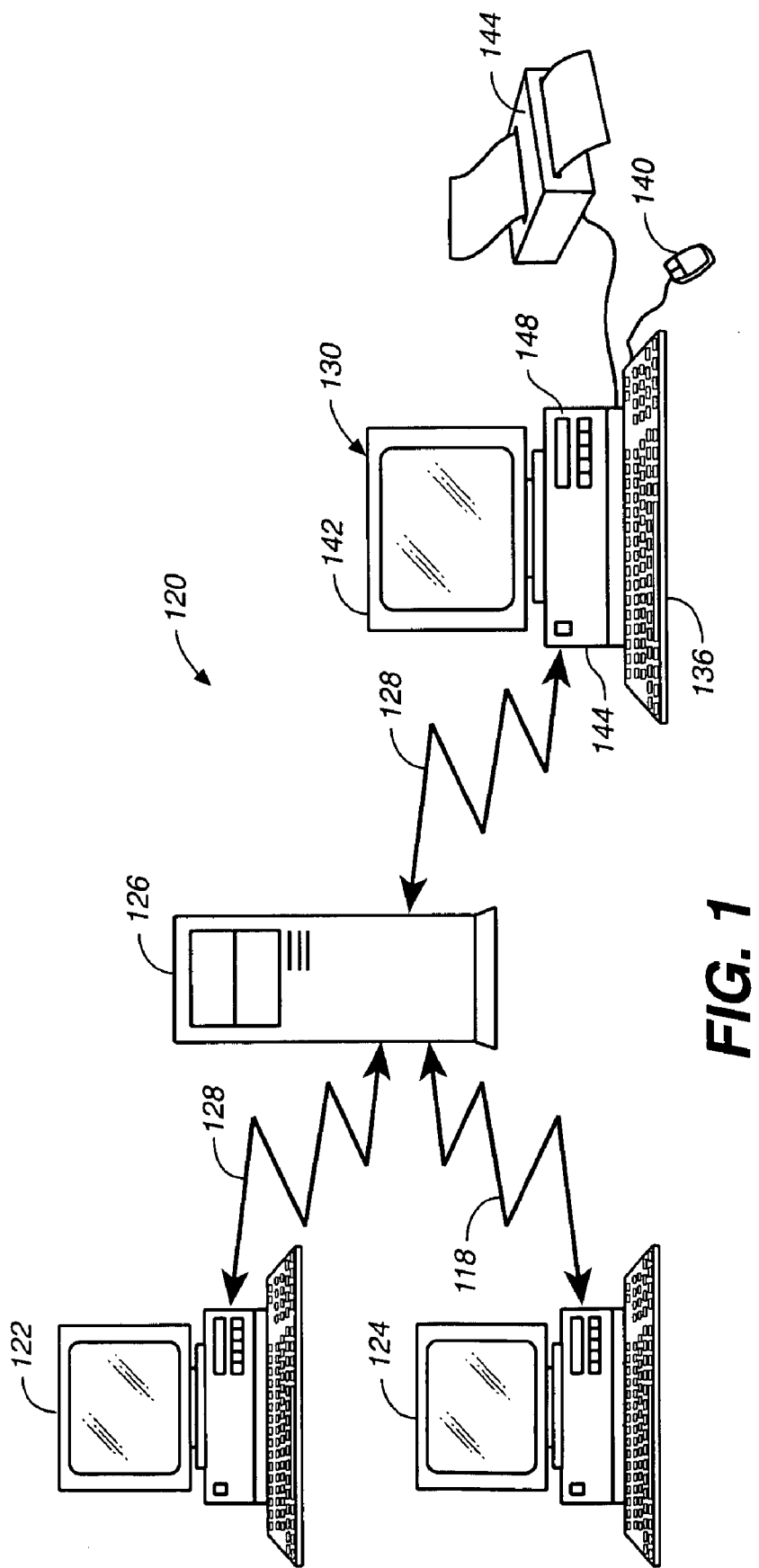
FIGS. 1 and 2 are simplified block diagrams of a computer network and a computer processor implementing the method by which a semiconductor platform having the multiple frequency grid of the invention can be fabricated in accordance with an embodiment of the invention.

Referring to FIG. 1, which illustrates an exemplary computer system 120 upon which a tool to generate the multiple frequency grid structure as disclosed herein, could be installed and/or used. Computer system 120 is illustrated as a networked computer system that includes one or more client computers 122, 124 and 130 such as workstations coupled through a network 128 to a server 126. Server 126 could also be a personal computer, a workstation, a midrange computer, or a mainframe computer. While shown here as a point-to-point connection, computers 122 and 124 need not be coupled to server 126 directly, but may be coupled to yet another network which in turn is connected to server 126. Network 128 represents any type of networked interconnection including but not limited to local-area, wide-area, wireless, and public networks such as the Internet or an Intranet, and any number of routers and hubs connected in between, e.g., a local-area network to a wide-area network to the Internet through a series of routers and/or other servers. Any number of computers and other devices may be networked through network 128, e.g., multiple servers, hand-held devices, etc.

For the purposes of the invention, computer 130 may represent practically any type of computer, computer system, or other programmable electronic device, including a client computer similar to computers 122, 124 of FIG. 1, a server computer, e.g., similar to server 126 of FIG. 1, a portable computer, an embedded controller, a hand-held device, etc. Computer 130 may be coupled in a network 128 as shown in FIG. 1 or may be a stand-alone device. Computer 130 will hereinafter also be referred to as a computer although it should be appreciated that the term "computer" may also include other suitable programmable electronic devices capable of allowing a chip designer to take advantage of the method and/or article of manufacture having steps to modify the platform as described herein.

Figure 2:
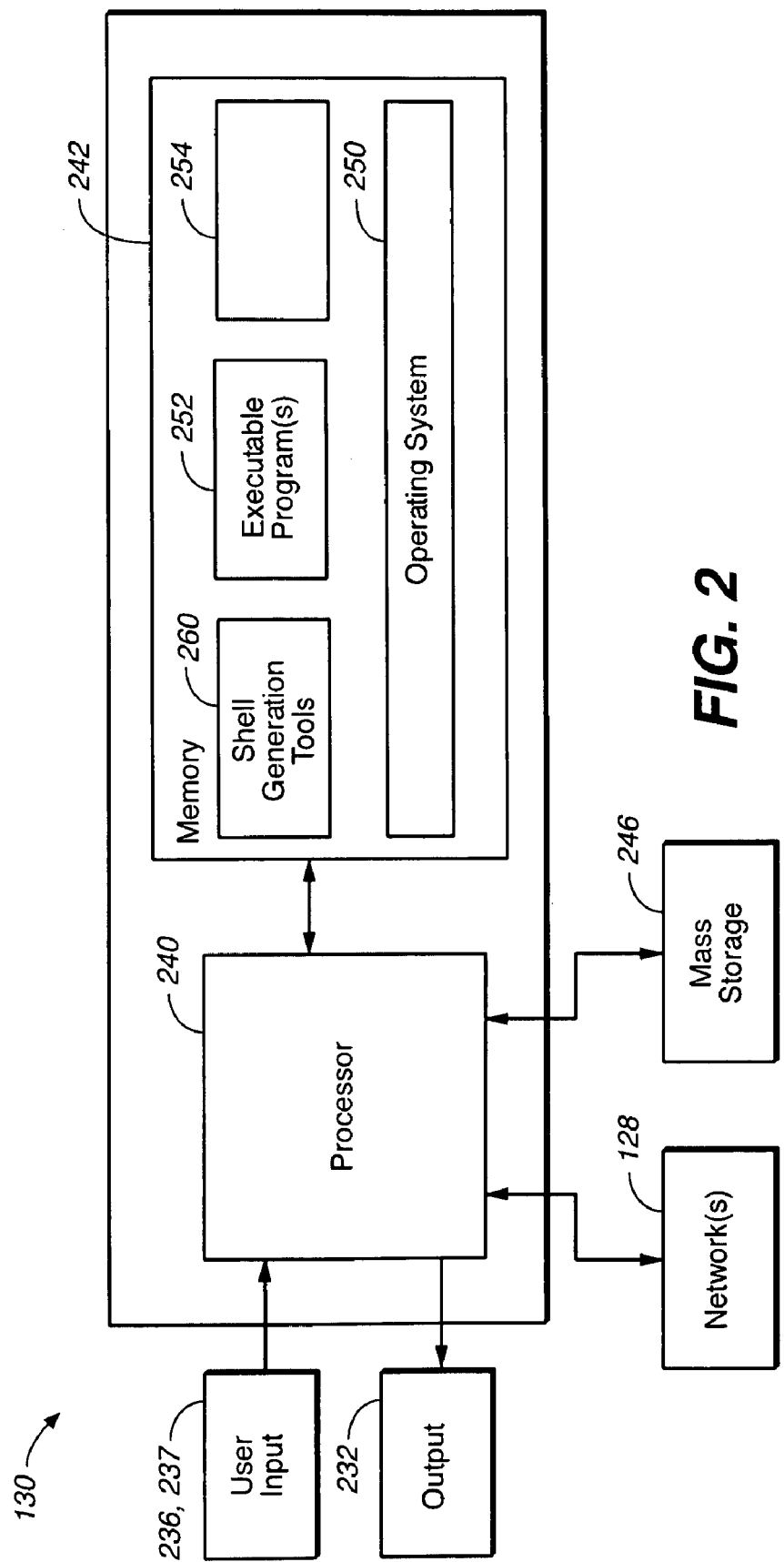

With reference to FIGS. 1 and 2 wherein the method and apparatus of generating a multiple frequency grid structure for a semiconductor product during design as disclosed herein is installed as an application on computer 130. Computer 130 typically receives a number of inputs and outputs for communicating information externally. For interface with a user or operator, computer 130 typically includes one or more user input devices 236, 237, e.g., a keyboard 136, a mouse 140, a trackball, a joystick, a touchpad, and/or a microphone, among others, and output devices 232, such as a display 142 such as a CRT monitor, an LCD display panel, a printer 144, and/or a speaker, among others. Some servers, however, do not support direct user input and output. For additional storage, computer 130 may also include one or more storage devices 246, e.g., a floppy or other removable disk drive, a hard disk drive, a direct access storage device, an optical drive, e.g., a CD drive, a DVD drive, etc., and/or a tape drive, among others, that may be connected directly or may be connected through a storage area network (SAN) or other network. Furthermore, computer 130 may include an interface connected to one or more networks 128, e.g., a local-area network, a wide-area network, a wireless network, and/or the Internet, among others, to permit communication of information with other computers 122, 124 coupled to the network 128. It should be appreciated that computer 130 typically includes suitable analog or digital interfaces between processor 130 and each of the components 228, 232, 236, 237, and 246 as is known in the art.

Computer 130 typically includes at least one processor 240 coupled to a memory 242. Processor 240 may represent one or more processors or microprocessors and memory 242 may represent the random access memory (RAM) devices comprising the main storage of computer 230, as well as any supplemental levels of memory such as cache memories, nonvolatile or backup memories, programmable or flash memories, read-only memories, etc. In addition, memory 242 may be considered to include memory storage physically located elsewhere in computer 130, e.g., any storage capacity used as a virtual memory, e.g., as stored on a mass storage device 246 coupled to computer 130 with a SAN or on another computer coupled to computer 130 via network 128.

Computer 130 may operate under the control of an operating system 250 such as a UNIX-based, LINUX-based, or WINDOWS-based operating system, as is known in the art, but is not so limited by the particular operating system, or indeed need not be under the control of any operating system. Operating system 250 typically executes various computer software applications, components, programs, objects, modules, etc., such as an executable program 252, etc. Although the tools and libraries 260 for developing an integrated circuit may be in memory 242, they need not be. The processor 240 may access the tools and libraries 260, the required data, other various applications components, programs, objects, modules, etc., resident on one or more processors in another computer coupled to computer 130 via a network 128, e.g., in a distributed or client-server computing environment whereby the processing to implement the functions of the correct shell generation tool may be allocated to multiple computers over a network.

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. The computer program instructions may also be loaded onto a computer to cause a series of operational steps to be performed on the same or other computer to implement the functions/acts specified in the flowcharts and/or block diagram block or blocks. These computer program instructions may also be stored in a computer-readable memory that can direct a computer to function in a particular manner, such that the instructions stored in the computer-readable memory produce an article of manufacture including instructions on a signal bearing medium that install and implement the function/act specified in the flowchart and/or block diagram block or blocks. Examples of signal bearing media include but are not limited to recordable type media such as volatile and nonvolatile memory devices, floppy and other removable disks, hard disk drives, optical disks, e.g., CD-ROMs, DVDs, etc., among others, and transmission type media such as digital and analog communication links, for example, the Internet using an Internet Service Provider.

A foundation upon which the multiple frequency grid structure is built is the application set. An application set is, inter alia, a description of the platform and the required definition that make the platform useful to a chip designer. Viewing FIG. 3, a platform 310 is a partially manufactured semiconductor device in which the semiconductor wafer layers up to the connectivity layers have been fabricated. The platform 310 comprises a base semiconductor wafer from, e.g., silicon, silicon-on-insulator, silicon germanium, gallium arsenide, other Type II, III, IV, and V semiconductors, etc. and is a piece of semiconductor material into which modules have been diffused into the semiconductor layers. Diffusing a semiconductor wafer to create modules simply means that during fabrication of the wafer layers, transistors or other electronic devices have been particularly arranged in the wafer layers to achieve specific functions, such as diffused memory an example of which might be high speed data and/or instruction caches 320-322 for a processor, data transceiver hardware such as I/O PHYs 340-346, clock factories including phase-locked loops (PLLs) 350, control I/Os 352, configurable input/output (I/O) links 354, 356. Diffusion ensures that each of the diffused modules have an optimum arrangement and density of transistors to realize its particular function. Diffused modules can be further classified into hardmacs, firm, or soft. Hardmacs are those modules for a specific function whose connection and timing parameters have been fully specified. Firm modules are those in which the timing and connections within the modules have been specified but the connections outside the boundary of the module have yet to be specified and implemented. Soft modules are those in which only the register transfer logic (RTL) for a specific function has been set forth; the RTL still needs to be synthesized into the transistor fabric, but can be placed in the transistor fabric anywhere on the chip.

The platform definition is a detailed listing of the features available on the platform, such as the area and availability of transistor fabric, the I/O and memory available, the requirements of the hard, firm, and soft modules, the cost of the platform, the expected operating frequency and performance, the expected power consumption, and other functional requirements. For diffused memory elements, the platform definition may include, inter alia, details of the area and physical placement of the memory array and its interface/connection pins, the bit width, depth, and organization, e.g., numbers of read/write ports, bit masking, and the cycle time. Also included may be a list of memories and/or registers having tie-offs, i.e., the memories and/or registers that will not be used for data flow and may thus be allocatable for performance enhancing features such as control status registers, etc. For diffused I/O elements, the platform definition may provide, inter alia, the types of I/O, the I/O drive strength, etc. For diffused PLL or clock elements, the platform definition provides the expected frequencies at which the platform may operate, the duty cycle, etc. Other details of the platform definition may include the configuration of the transistor fabric and the diffused and compiled elements, the status of the logic, the required control signals and the features enabled by the control signals, whether any element requires testing, the location and the number of the elements on the platform, etc. The I/O blocks and I/O diffused areas and any registers associated with the hardmac and configurable I/Os must be timed and connected to the PLLs, the I/O netlists, test logic such as a JTAG TAP controller, and lock detect circuits, an Ethernet interface, a CPU connection interface, and/or an EEPROM interface. The platform definition includes these and other features necessary to implement the multiple frequency grid of the platform. Plus, correct and proven logic interfaces connecting all the components with each other and with the outside world through hardmacs and configured logic towards the periphery of the platform may be included in the platform definition.

The platform definition further includes accompanying RTL for the placement and timing of these diffused components. The accompanying RTL may be as simple as a logic signals directly connected to external chip I/Os, or it may be more complex logic upon which another chip developer can build and include one or more clock generators, system controllers and reset logic, test controllers, and/or analog serializers/deserializers (SERDES) hardmac components. The RTL may further contain the connectivity bus logic requirements between the various modules on an internal bus and/or external bus and thus may include arbiters, multiplexers, decoders, etc. to manage the connectivity and, if necessary, the address translation and register/memory coherence schemes. For example, the RTL may include the complete infrastructure to support a PCI bus controller including all the connections to external I/Os and/or a DDR/SRAM memory controller or a processor subsystem. The accompanying RTL facilitates matching and binding the memories, register blocks, any cores in order to, e.g., match protocols and correctly bind the correct I/O hardmacs PHYs, such as an XGXS to support data transfer at Gigabit Ethernet speeds, or a MW SPI-4 core.

While the preceding discussion of the platform description is not intended to be limitative, it is nonetheless, fairly representative of the infrastructure necessary to use the platform and create a functional semiconductor product from the platform. Another way to consider the platform description is that it comprises: (a) a logical description of the platform as RTL; (b) a functional description of the resources—documentation; (c) a functional verification description that may include components such as transactors, monitors or interface checkers, scoreboards, reference models, and test suites between the internal logic interfaces and the chip I/Os; (d) a generation description of optimized scripts for the slice's gate array to synthesize any generated logic for the final applications; (e) timing constraints for all blocks and interfaces which may include stamp models of the RTL shell components connected to the chip I/Os; (f) a manufacturing test description which might include the stub interface that brings scan chains to the customer logic plus any preexisting test engines and mechanisms in the platform; and (g) the floorplan or a location description of the platform resources. The platform description listed, moreover, preferably provides proven interfaces and controllers that comply with industry standards. The platform description may also include the necessary information for a designer to integrate her/his requirements into a particular platform.

Along with the diffused components of the platform, the platform further comprises an area or sea of transistor fabric 360 for further development of the platform 310. Transistor fabric 360 is an array of prediffused transistors that can be logically configured to achieve the multiple frequency grid structure and the decoupling capacitance described herein. A cell refers to the personalization of the interconnect layers that instantiate the logic gates of the transistor fabric. The placement of the modules as described above, compiled memories, and the reserved areas of the transistor fabric 360 preferably are situated to achieve optimal timing and performance both within the platform 310 and for the platform 310 to connect externally.

The platform 310 may also include a mask and higher layers of connectivity that can be configured in accordance with principles of the invention for distribution of power, ground, decoupling capacitance, and external signal I/O. Around the periphery of the platform are a number of I/O blocks 352, 354, 356 which may provide control voltages for the clock, power, and ground, and a port for connection to JTAG, PLL signals, etc. Other I/O blocks may be configurable for other I/O protocols to be determined to connect to different voltage signals, such as low voltage transistor to transistor logic (LVTTL) signals at a speed on the order of several hundred Mbps or less, or LVDS signals, or CML signals at a speed on the order of several Gbps.

Figure 3:
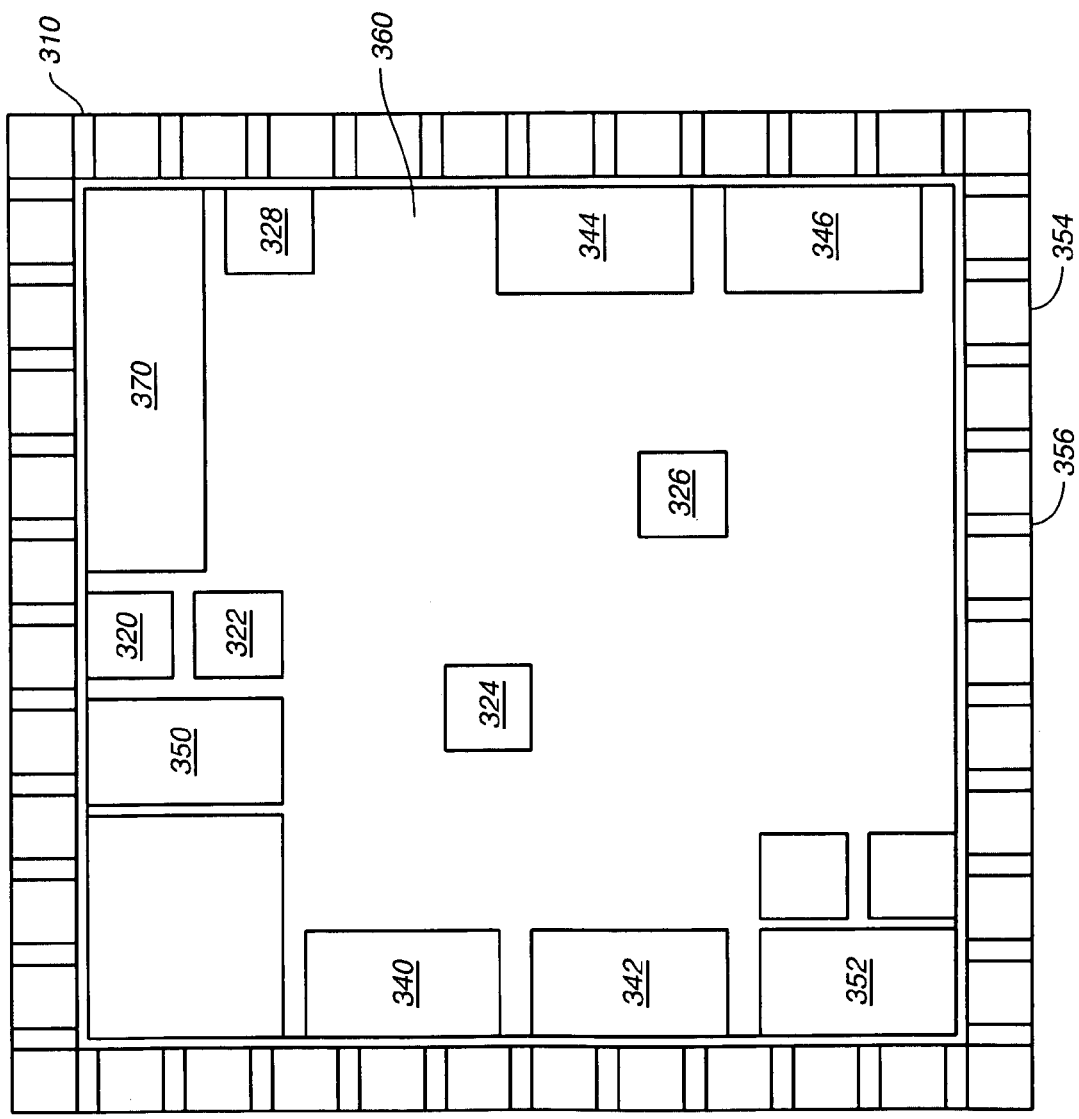
FIG. 3 is a simplified block diagram of a semiconductor product that is an example of one that can take advantage of an implementation the multiple frequency grid of the invention.

The platform 310 shown in FIG. 3 is only one example of a platform and its components. Different application sets may contain different amounts and arrangements of transistor fabric, different amounts of diffused and/or compiled memories, both fixed and configurable I/O blocks, clocks, etc. depending upon the purpose of the final integrated chip. For instance, if the final chip is intended to be a communication and/or network integrated circuit, the periphery of the platform may contain many diffused I/O hardmacs fixed as PHYs and/or that can be configured differently from one another. Likewise, if the final integrated chip is intended to be a specialized microprocessor then it may not have as many I/O hardmacs or configurable I/O, and more or less diffused registers and memories. The point is that there are different application sets for different semiconductor products The application set for the multiple frequency grid structure is preferably created using a suite of generation tools as described in the following U.S. patent applications, commonly owned by the assignee herein and hereby incorporated by reference in their entireties: U.S. Pat. No. 7,020,852 issued Mar. 9, 2006 entitled AUTOMATION OF THE DEVELOPMENT, TESTING, AND RELEASE OF A FLOW FRAMEWORK AND METHODOLOGY TO DESIGN INTEGRATED CIRCUITS; Ser. No. 10/318,792 filed 13 Dec. 2002 entitled FLEXIBLE TEMPLATE HAVING EMBEDDED GATE ARRAY AND COMPOSABLE MEMORY FOR INTEGRATED CIRCUITS; U.S. Pat. No. 7,069,523 issued Jun. 7, 2006 entitled AUTOMATED SELECTION AND PLACEMENT OF MEMORY DURING DESIGN OF AN INTEGRATED CIRCUIT, U.S. Pat. No. 6,823,502 issued Nov. 4, 2004 entitled PLACEMENT OF CONFIGURABLE INPUT/OUTPUT BUFFER STRUCTURES DURING DESIGN OF INTEGRATED CIRCUITS; U.S. Pat. No. 7,055,113 issued May 10, 2006 entitled A SIMPLIFIED PROCESS TO DESIGN INTEGRATED CIRCUITS; U.S. Pat. No. 6,959,428 issued Oct. 5, 2005 entitled DESIGNING AND TESTING THE INTERCONNECTION OF ADDRESSABLE DEVICES OF INTEGRATED CIRCUITS; and U.S. Pat. No. 7,257,799 issued Jul. 25, 2007 entitled FLEXIBLE DESIGN FOR MEMORY USE IN INTEGRATED CIRCUITS.

The application set is input to and constrains all other generated parameters and other user input to make the platform useful to design a semiconductor product. Using the multiple frequency grid generation tool and other tools and libraries such as those referenced above, a chip designer can integrate her/his customers requirements with the platform's resources and definition to verify and synthesize designs, insert clocks, create interconnections for tests, and then integrate the designs together to create a complete design of a platform that can simultaneously operate at several frequencies. The resultant design, moreover, when created using the multiple frequency grid generation tool is a qualified netlist with appropriate placement and routing amongst the existing resources and for external connections to a board. To create a customized chip, all that is needed is a small set of remaining masks to create the interconnections between the preplaced elements.

Figure 4:
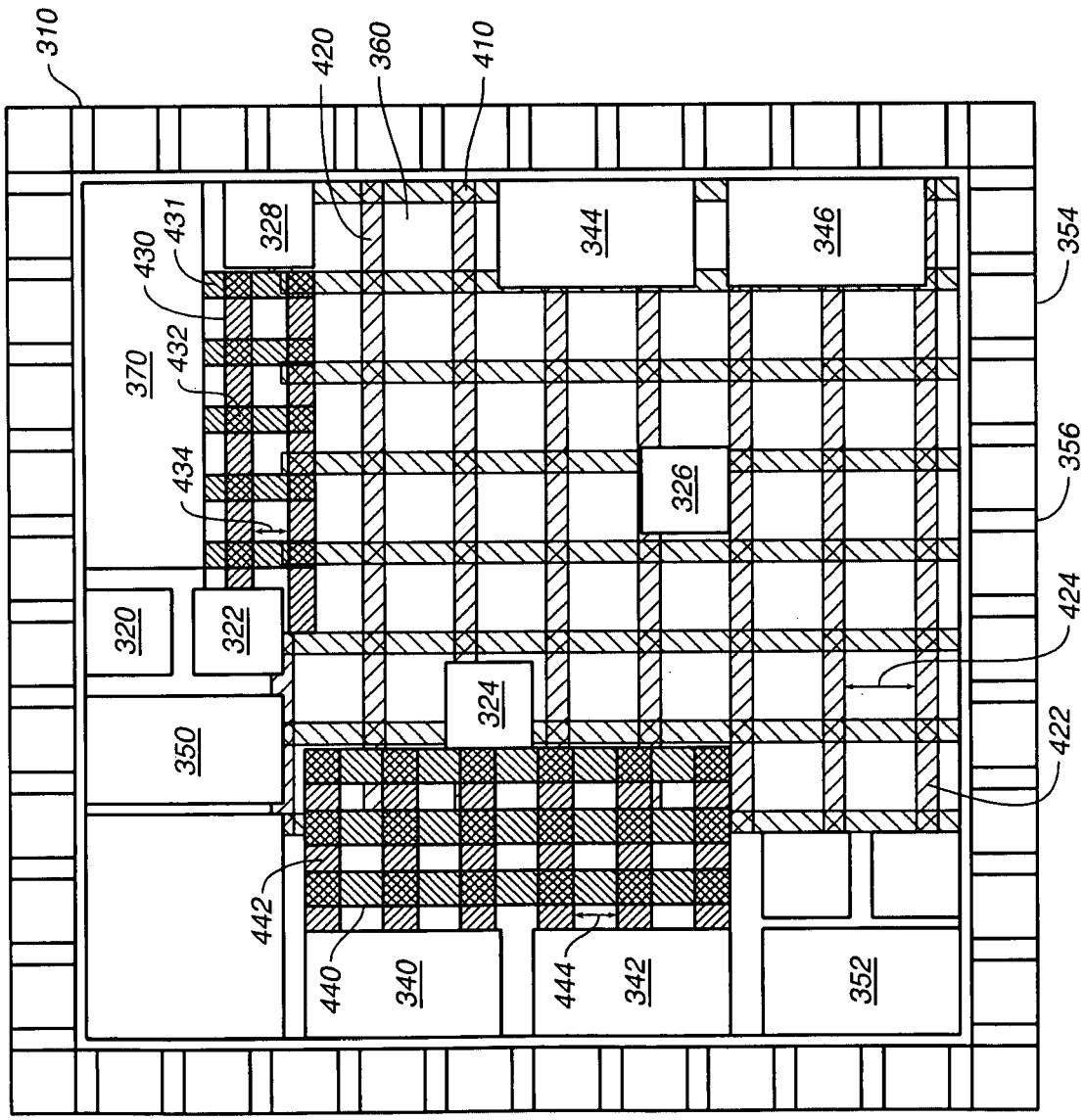
FIG. 4 is a simplified block diagram of the semiconductor product as above but having an application set upon which the multiple frequency power mesh of the invention has been fabricated in accordance with an embodiment of the invention.

With respect to FIG. 4, features of an embodiment of a platform having a multiple frequency power mesh are shown. The inventors have realized that high frequency operations such as processing and/or data transfer may be required in only localized areas 430, 440 of a final semiconductor product. In order to provide the capability to take full advantage of these higher frequency functions, the inventors have included a power mesh having localized regions, each with a different power capability and density to support different frequency operations. Preferably, the power mesh has localized grids in the proximity of blocks of transistors that support high frequency I/O interfaces and/or high frequency processing functions or other high frequency specifications. The modified power mesh having the localized grids are characterized by a higher density of power, and ground straps, and decoupling capacitors to accommodate the higher frequency switching of transistors. These localized grids for higher frequency operations can be included in a fixed power mesh of the application set handed off to a chip designer. Alternatively, the chip designer can configure or program the power mesh with the localized grids from the programmable layers as part of the chip design process.

To support the higher frequency switching of the transistors in the transistor fabric 360, more power and decoupling capacitance is provided to the transistors. The power and ground straps of the mesh may be wider and/or the pitch may be denser. FIG. 4 is the platform shown previously in FIG. 3 but now having a power mesh 410 of power/ground straps and varying capacitance above a configurable transistor fabric 360. Note that the power mesh 410 comprises three localized areas 420, 430 and 440 in which the density and the width of the power/ground straps grid may vary between the localized regions. For instance, power mesh 410 may have a regular pattern 420 of power/ground straps 422 with a relatively large pitch 424 to support a frequency normally anticipated of the application set. The power mesh of the localized grid 430 may have a smaller pitch 430, i.e., the distance between the straps, and/or the straps 434 may be wider than the straps of the localized area 410. The power mesh of localized grid 440 may have yet a smaller pitch 444 than either or both the localized grids 420, 430 and/or still wider power/ground straps 442.

Figure 5A:
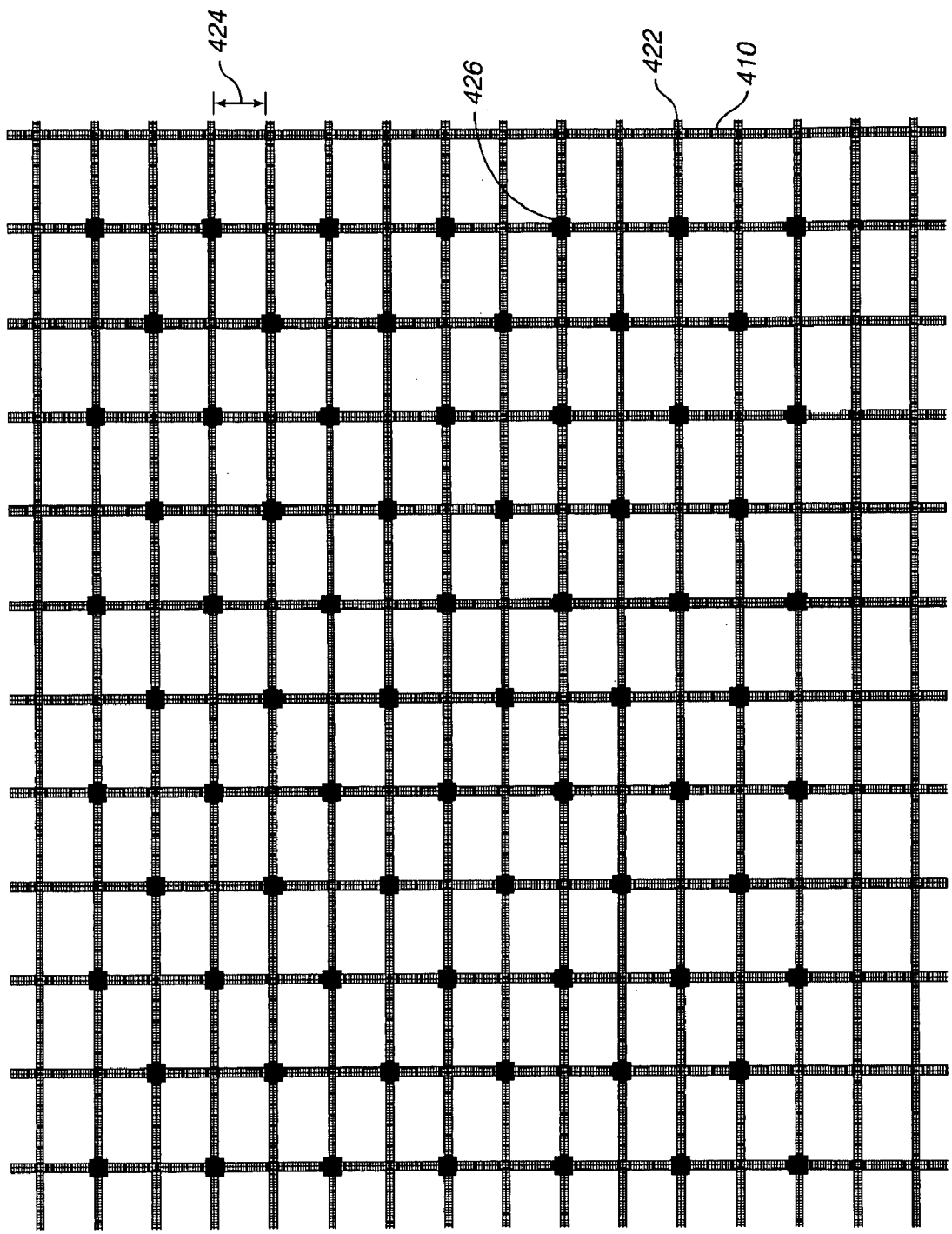
FIGS. 5*a*, 5*b*, and 5*c* are different embodiments of a localized grid that can be implemented on a modified power mesh of a semiconductor platform in accordance with the invention.
Figure 5B:
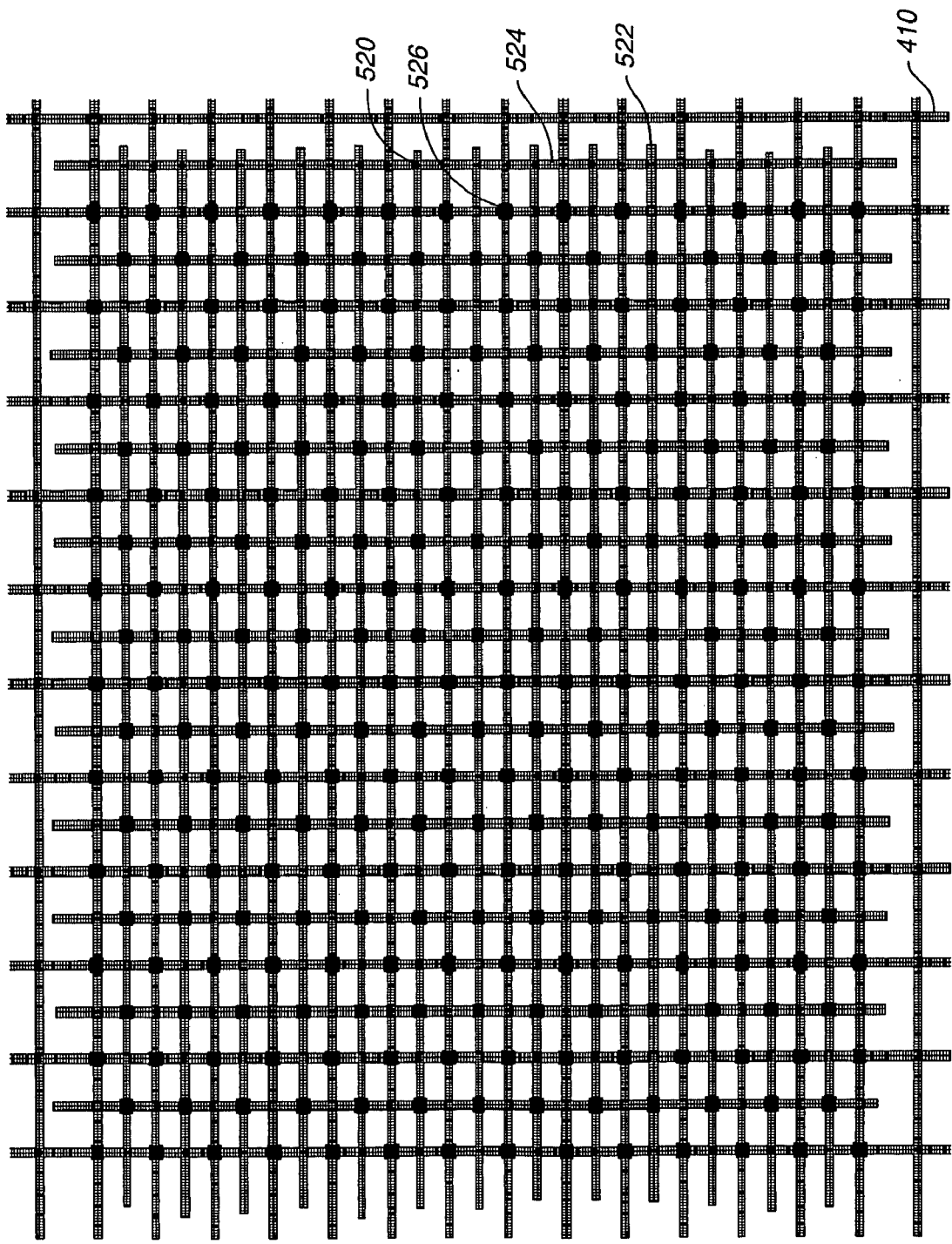
Figure 5C:
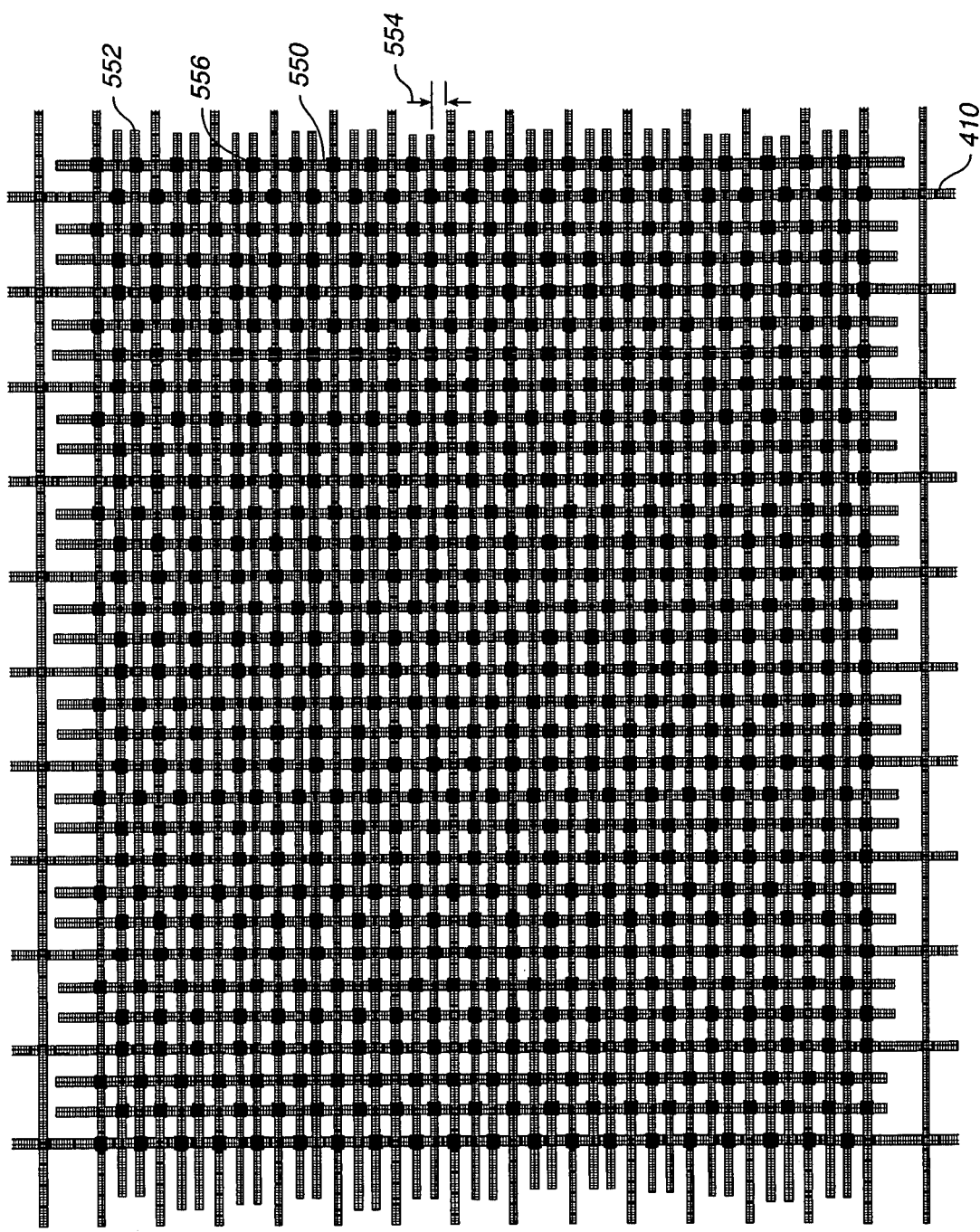

Shown in FIG. 5a is a power mesh that supports normal processing such as the power mesh 410 of FIG. 4. FIG. 5b illustrates a more dense power mesh 520 in which the density of power and ground straps 522 are twice the density of the power/ground straps 422 of FIG. 5a. Thus, power mesh 520 of FIG. 5b can support high frequency operations. Note that the straps 522 of power mesh 520 shown in FIG. 5b may or may not be wider than the straps 422 of power mesh 410 of FIG. 5a, but the pitch 524 is smaller. Similarly, the density of power/ground straps may be even greater with still a smaller pitch 554, such as shown in FIG. 5c. There may be three times the number of power/ground straps 552 in the more dense power mesh 550 of FIG. 5c. The strap width of the localized grid of FIG. 5c may or may not vary from that of FIGS. 5a and/or 5b. It is contemplated that a platform may have one or more of these grids to support the multiple frequency operation, i.e., a single platform may contain the power mesh 410 and the power mesh 520 and the power mesh 550. Again, the densities given are only examples, and the pitches between the power/strap lines need not be integer values of each other, or be limited to the numbers presented. Similarly, there may be many more than two or three localized areas of different power meshes on a platform to support multiple and optimum frequencies for a given function.

Thus, several methods to add greater power to the transistors, either embedded or fixed in the layers of the application set or configured from the transistor fabric, for high frequency operation include decreasing the pitch between the power/ground straps and/or increasing the width of each individual strap. Another aspect of the invention is to configure the modified power mesh over and/or under a configurable area of transistors, as well as embedded or diffused transistors.

Previously the art teaches that the power mesh is fixed, not only in frequency but also across the semiconductor die in layers below the configurable transistor areas. By way of example only, in 110 nanometer (nm) gate technology, prior art decoupling capacitors are diffused in two rows out of every ten rows of programmable cells thus creating a fixed amount of decoupling. The transistor fabric as described herein, however, can accommodate greater performance with higher frequencies and greater power. The inventors thus had the insight to add decoupling capacitance at a higher density to the application set during the design phase to a multiple frequency power mesh having localized grids to support multiple frequency performance.

The methods by which to add the multiple frequency power mesh to the application set include fixing the power mesh in the application set, but within a single or multiple layers, the densities and/or width of the power/ground straps may vary such as in FIGS. 4, and 5a, 5b, 5c. In other words, the application set given to the designer has the fixed power mesh with localized regions of different frequency operation. Alternatively, the power mesh may be configurable during the design of the semiconductor product. In this method, a chip designer has been given an application set not necessarily having the localized areas of the power mesh. Instead, the chip designer will program or configure the power mesh to have the localized grids to support different frequency operations. These two methods of realizing the multiple frequency power mesh are not exclusive of one another and, moreover, can be combined with two embodiments of incorporating increased decoupling capacitance into the modified power mesh. First, decoupling capacitors could be embedded in the selected areas of high frequency operation, in layers under and/or above configurable transistor fabric. Another embodiment could be that the R-cell transistor fabric itself can be configured or programmed to be decoupling capacitors. See, e.g, Sanjay, Dabral et al., BASIC ESD AND I/O DESIGN, John Wiley and Sons, Ltd. 183-217 (1999). By doing so, the capability to increase localized decoupling capacitors is enabled and the performance bar can be raised. The method to design the final semiconductor product could incorporate both techniques to mitigate harmonic interference; by way of example only, first, the chip designer can program or configure both the power mesh having localized grids of variable frequency and the decoupling capacitance; second, the application set given the chip designer can have fixed power mesh having localized grids, each capable of different frequency support, but the chip designer can configure additional decoupling capacitance from the transistor fabric as discussed; third, the application set itself can have a fixed power mesh having localized grids, each capable of different frequency support, and a fixed decoupling capacitance in the layers either above or below the functions requiring the different frequency operation; and fourth, the application set may have fixed additional decoupling capacitance in anticipation of a chip designer opting to program or configure the metal layers for a power mesh having localized grids, each capable of different frequency operation.

For 110 nm technology, i.e., the length of the transistor gate is 110 nm, the enhanced programmable power mesh may be in the M4 and M5 layers; but the programmable power mesh could be in the M6 and M7 layers for 90 nm technology, i.e., the gate of the transistors is 90 nm. Lower metal layers are typically frozen, i.e., not configurable, because their fabrication is more expensive. For example M1 is typically fixed and the layers M2 through M5 can be configurable at less expense. Thus, if the power mesh having localized regions for different frequency operations is fixed, the application set given the chip designer may have the power mesh fixed in M1 layer. If, however, cost is not a consideration, the top two metal layers may be used to configure the power mesh for higher performance in terms of power and frequency within the localized areas.

Figure 6:
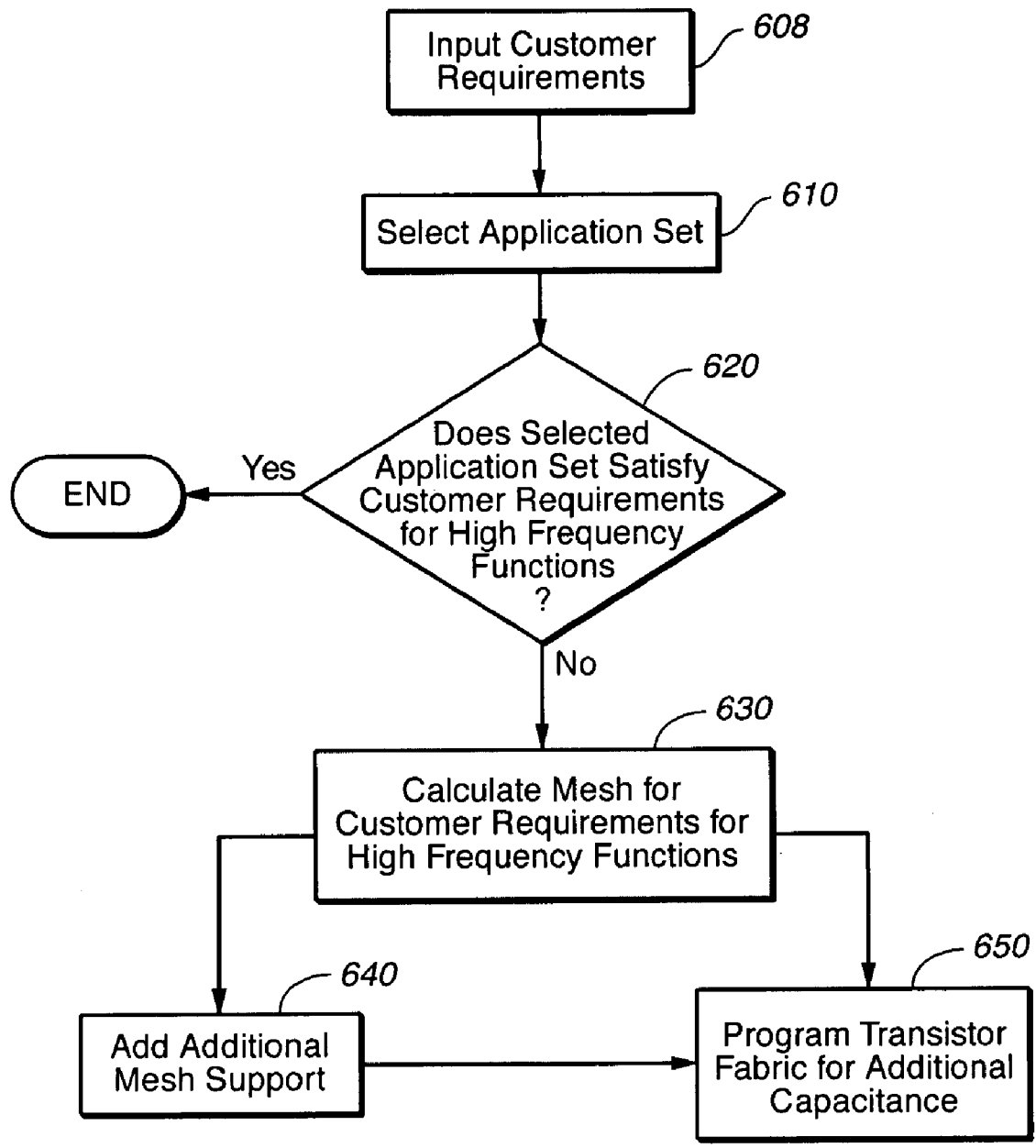
FIG. 6 is a simplified flow chart of a method whose steps may be embodied in an article of manufacture that implements a multiple frequency power mesh in a semiconductor platform.

FIG. 6 is a simplified flow chart of a method by which a multiple frequency grid can be configured for an application set. In step 608, a customer's requirements are input to the tool to generate a power mesh necessary to support multiple frequency operations. In step 610, an application set is selected, such as RAPIDCHIP PLATFORM available from LSI Logic. Preferably, this application set not only has the hardmacs preselected for a customer's requirements, but also incorporates layers having areas of a programmable transistor fabric. The selected application set may have an existing pattern of fixed decoupling capacitance, e.g., two rows of decoupling capacitors per every ten rows of programmable transistor fabric. In step 620, the designer evaluates whether the customer's specification for the design can be met with the selected application set. The customer usually provides, inter alia, the desired performance, i.e., frequency and power requirements, and the size of the area required for high frequency operations. By way of example only, a customer may specify an I/O interface in the proximity of a Gigablaze PHY having 200,000 gates to operate at 622 MHz. The power mesh including decoupling capacitance requirements can be calculated at step 630 using proprietary and/or commercially-available circuit analysis tools such as SPICE and voltage drop tools such as SIMPLEX. A default ratio of decoupling capacitance of two rows capacitors per every ten rows of programmable transistors is known to handle performance up to 250 MHz. When the customer's requirements for high frequency operations, as calculated using such programs as above, exceed the default performance of the selected application set, then at steps 640, additional support for an increased power mesh having greater decoupling capacitance and/or more power and ground straps can be added to the design as either fixed or configurable layers having localized grids above the embedded hardmacs and/or programmable transistor fabric requiring high frequency operations. Examples of such hardmacs and/or programmable functions requiring the higher frequencies may be a data link layer for an I/O interface or additional register support for high speed processing. In addition to or alternatively, at step 650, the transistor fabric can be programmed as decoupling capacitors in order to minimize the distorting harmonics of high frequency operation.

The localized grids of the modified power mesh for high frequency operations having an increased density of decoupling capacitance and power/ground straps are preferably placed in smaller areas to minimize engineering time needed to implement higher frequency functions while maintaining normal fabric densities elsewhere on the design. By way of example only, the multiple frequency power grids may interconnect anywhere from twenty thousand to half a million transistors, either diffused or configured from the transistor fabric, as is necessary to achieve the balance between high frequency operations and minimal disruption of the power balance. Support for high speed processing and/or high speed communication protocol may be needed but the entire chip does not have to function at the higher frequencies and higher power levels. One of the localized grids 440 for the multiple frequency power mesh may be in the proximity of high speed serial to parallel I/O PHYs 340, 342 to provide the high speed protocol link layers, such as Fibre Channel, PCI Express or Ethernet Gigabit. Quite typically, the protocol or coder/decoder next to a SERDES will operate at higher frequency but then the data may drop into a dual port memory and/or the bus width may double to lower the frequency and power. Another grid, e.g., grid 440, may be in the proximity of a high speed processor 370 to provide registers and/or cache memories and/or high speed, high bandwidth for the processor. The inventors have further determined that the flexibility of the high frequency grid is enhanced by placing it over the configurable transistor fabric. If high speed operations are not desired, the multiple frequency grid can certainly support lower frequency operations. The invention herein thus accommodates differences in frequency requirements across a semiconductor die.

Given a semiconductor platform having fixed and configurable layers, the inventors realized that both of these type of layers can be used to provide additional capacitance and support for an increased power mesh. Thus, the teaching is that a partially manufactured semiconductor platform having a multiple frequency grid structure can be designed and otherwise configurable to support high frequency electronic operations. The multiple variable grid structure can be applied to SPI4.2, Gigabit Ethernet protocols, high speed processors, but is not limited to these particular applications. The number and density of power/ground straps and decoupling capacitors that comprise the grid, moreover, can accommodate different frequency operations on the chip.

Any particular nomenclature is used merely for convenience, and thus the invention should not be limited to use solely in any specific application identified and/or implied by such nomenclature. The illustrated embodiments are not intended to limit the present invention. Indeed, those skilled in the art will recognize that other variable frequency functions may be implemented without departing from the scope of the following claims.

What is claimed is:

1. A method for implementing multiple frequency operations in a semiconductor platform, the method comprising steps of:
    selecting an application set, the application set having a plurality of physical resources comprising embedded functions and a configurable transistor fabric, a plurality of logical resources corresponding to the physical resources of the semiconductor platform;
    reading a customer's requirements comprising desired performance of a semiconductor product;
    determining that the selected application set does not meet the desired performance of the customer's requirements;
    calculating a plurality of parameters to meet the desired performance of the customer's requirements;
    modifying a configurable power mesh as a function of the desired performance of the customer's requirements, the configurable power mesh comprising at least first and second configurable grids, the first configurable grid being operable at a different frequency than the second configurable grid;
    modifying the configurable transistor fabric to meet the desired performance of the customer's requirements;
    programming a first portion of the transistor fabric to instantiate a first function having higher frequency operations than a second portion of the transistor fabric; and
    modifying the configurable power mesh in the vicinity of the first portion to support the first function having higher frequency operations;
    wherein each of the steps of the method is implemented by at least one processor.

2. The method of claim 1 further comprising a step adding decoupling capacitance in the vicinity of the first portion.

3. The method of claim 1 further comprising a step of programming the transistor fabric in the vicinity of the first portion as capacitors.

4. The method of claim 1 wherein the first function is data link layer for high speed I/O communications.

5. The method of claim 1 wherein the first function is high speed cache memory.

6. The method of claim 1 wherein the first function is a high speed data bus.

7. A method to design a semiconductor product configured for implementing multiple frequency operations therein, the method comprising steps of:
    selecting an application set, the application set having a plurality of physical resources comprising embedded functions and a configurable transistor fabric, a plurality of logical resources corresponding to the physical resources of the semiconductor platform, one of the physical and logical resources being a fixed power mesh having localized grids, each grid capable of operating at a different frequency than another grid;
    reading a customer's requirements comprising desired performance of a semiconductor product;
    determining that the selected application set does not meet the desired performance of the customer's requirements;
    calculating a plurality of parameters to meet the desired performance of the customer's requirements;
    modifying the configurable transistor fabric to meet the desired performance of the customer's requirements;
    programming a first portion of the transistor fabric to instantiate a first function having higher frequency operations than a second portion of the transistor fabric; and
    connecting the first portion to one of the localized grid of the fixed power mesh in the vicinity of the first portion to support the first function having higher frequency operations;
    wherein each of the steps of the method is implemented by at least one processor.

8. The method of claim 7 further comprising a step adding decoupling capacitance in the vicinity of the modified power mesh.

9. The method of claim 7 further comprising a step of programming the transistor fabric in the vicinity of the first portion as capacitors.

10. A computer program product tangibly embodying instructions for a computer comprising:
    means to read a design specification for a semiconductor product;
    means to read an application set compromising a platform description having a plurality of hardmacs, a transistor fabric, and a plurality of logic shells to enable the application set to incorporate the design specification to produce the semiconductor product;
    means to determine that the application set cannot satisfy at least one performance requirement of the design specification;
    means to assign a first portion of a transistor fabric of the platform to instantiate a first function having higher frequency operations than a second portion of the transistor fabric as a function of the at least one performance requirement; and
    means to modify a configurable power mesh as a function of the at least one performance requirement, the configurable power mesh comprising at least first and second configurable grids, the first configurable grid being operable at a different frequency than the second configurable grid, the configurable power mesh being modified in the vicinity of the first portion to support the first function having higher frequency operations to satisfy the performance requirement.

11. The computer program product of claim 10 further comprising means to decrease the pitch of the power and ground straps and means to add decoupling capacitance to the power mesh.

12. The computer program product of claim 11 further comprising means for programming transistors in the transistor fabric as capacitors into the vicinity of the first portion.

13. The computer program product of claim 10 further comprising means for increasing width of the power/ground straps.

14. The computer program product of claim 13 further comprising means for programming transistors in the transistor fabric as capacitors into the vicinity of the first portion.

15. A computer program product tangibly embodying instructions for a computer comprising:
    means to read a design specification for a semiconductor product;
    means to read an application set compromising a platform description having a plurality of hardmacs, a transistor fabric, a fixed power mesh having a plurality of localized grids, each grid capable of operating at a different frequency than another grid, and a plurality of logic shells to enable the application set to incorporate the design specification to produce the semiconductor product;
    means to assign a first portion of a transistor fabric of the platform to instantiate a first function having higher frequency operations than a second portion of the transistor fabric as a function of at least one performance requirement; and
    means to connect the first portion of the transistor fabric to one of the localized grids of the fixed power mesh in the vicinity of the first portion to support the first function having higher frequency operations to satisfy the performance requirement.

16. The computer program product of claim 15 further comprising means to configure additional capacitance from the transistor fabric in the vicinity of the first portion of the transistor fabric.

17. The computer program product of claim 15 further comprising means for connecting the one of the localized grids of the fixed power mesh to additional capacitance embedded in the application set.

* * * * *